(12) United States Patent
Lee et al.

(10) Patent No.: US 10,797,121 B2
(45) Date of Patent: Oct. 6, 2020

(54) DISPLAY APPARATUS WITH A REDUCED PERIPHERAL AREA

(71) Applicant: SAMSUNG DISPLAY CO, LTD., Yongin-si, Gyeonggi-do (KR)

(72) Inventors: Dong-Hyun Lee, Suwon-si (KR); Deukjong Kim, Cheonan-si (KR); Jaehak Lee, Suwon-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 16/059,553

(22) Filed: Aug. 9, 2018

(65) Prior Publication Data

US 2019/0206958 A1 Jul. 4, 2019

(30) Foreign Application Priority Data

Jan. 2, 2018 (KR) ........................ 10-2018-0000369

(51) Int. Cl.
*H01L 27/32* (2006.01)
*H01L 51/52* (2006.01)

(52) U.S. Cl.
CPC ...... *H01L 27/3248* (2013.01); *H01L 27/3258* (2013.01); *H01L 27/3265* (2013.01); *H01L 27/3276* (2013.01); *H01L 27/3246* (2013.01); *H01L 51/5237* (2013.01)

(58) Field of Classification Search
CPC combination set(s) only.
See application file for complete search history.

(56) References Cited

U.S. PATENT DOCUMENTS

| | | | |
|---|---|---|---|
| 2011/0115771 A1* | 5/2011 | Cheng | G09G 3/3696 345/211 |
| 2015/0187279 A1* | 7/2015 | Lee | G09G 3/3225 257/40 |
| 2015/0280169 A1* | 10/2015 | Choi | H01L 27/3258 257/72 |
| 2017/0287996 A1 | 10/2017 | Kim et al. | |

* cited by examiner

*Primary Examiner* — Moin M Rahman
(74) *Attorney, Agent, or Firm* — F. Chau & Associates, LLC

(57) ABSTRACT

A display apparatus includes a display area in which a plurality of pixels are disposed to display an image and a peripheral area which is a non-display area. The display apparatus includes a first power line which is disposed in the peripheral area and provides a first voltage to the plurality of pixels, and a second power line which is disposed in the peripheral area and provides a second voltage different from the first voltage to the plurality of pixels. At least a portion of the first power line overlaps the second power line in the peripheral area.

18 Claims, 11 Drawing Sheets

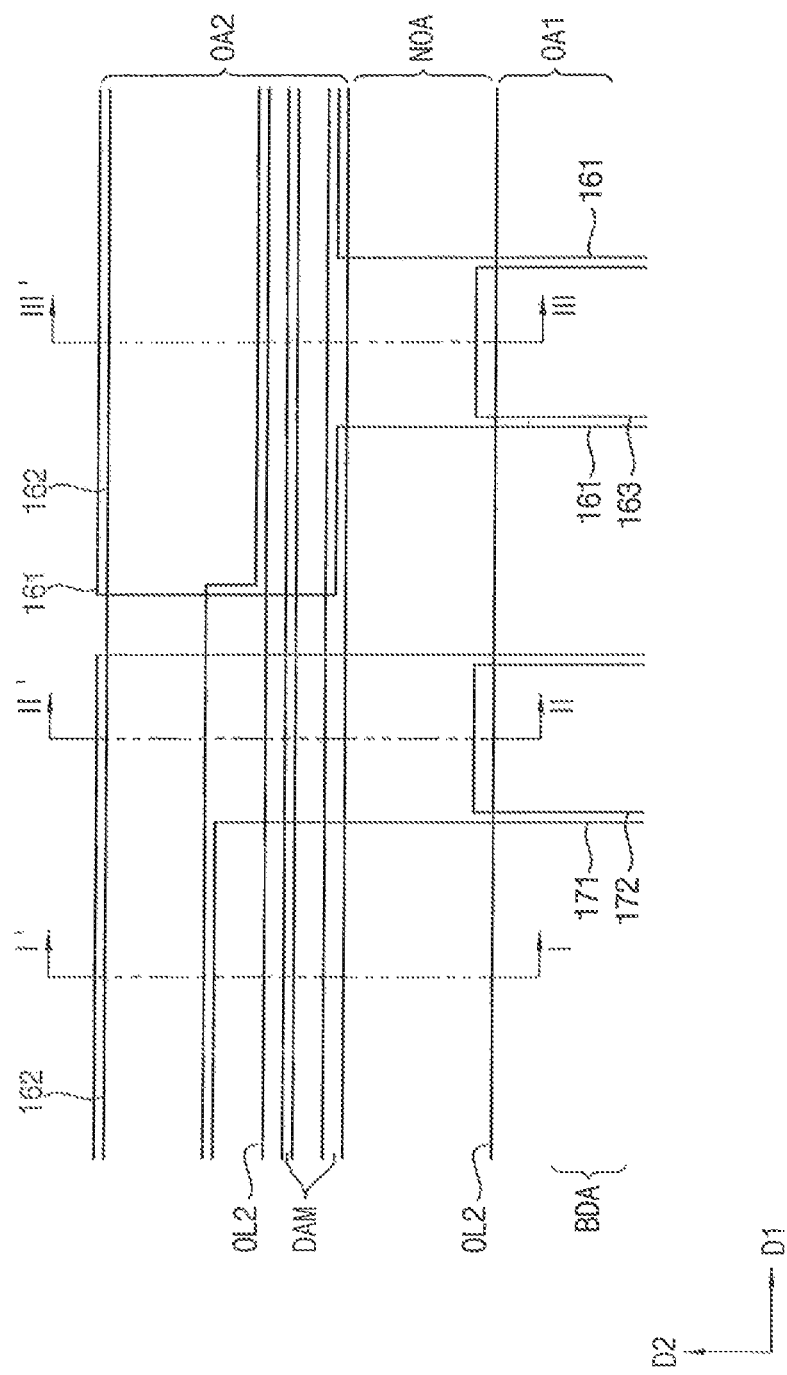

DISPLAY APPARATUS WITH A REDUCED PERIPHERAL AREA

CROSS-REFERENCE TO RELATED APPLICATION

The present application claims priority under 35 U.S.C. § 119 to Korean Patent Application No. 10-2018-0000369, filed on Jan. 2, 2018 in the Korean Intellectual Property Office, the disclosure of which is incorporated by reference herein in its entirety.

TECHNICAL FIELD

Exemplary embodiments of the inventive concept relate to a display apparatus, and more particularly, to a display apparatus capable of reducing a peripheral area which is a non-display area.

DISCUSSION OF RELATED ART

In the past, cathode ray tube (CRT) displays were popular due to performance and competitive prices. However, CRT displays have a weakness with regards to size and portability. Therefore, other kinds of display apparatus were developed, such as plasma displays, liquid crystal displays, and organic light emitting displays, which have comparatively smaller size, lighter weight, and lower power consumption.

As these displays become more widely used, there is a growing demand for increasing the ratio of a display area where an image is provided to a non-display area where the image is not provided.

SUMMARY

According to an exemplary embodiment of the inventive concept, a display apparatus includes a display area in which a plurality of pixels are disposed to display an image and a peripheral area which is a non-display area. The display apparatus includes a first power line which is disposed in the peripheral area and provides a first voltage to the plurality of pixels, and a second power line which is disposed in the peripheral area and provides a second voltage different from the first voltage to the plurality of pixels. At least a portion of the first power line overlaps the second power line in the peripheral area.

In an exemplary embodiment of the inventive concept, the second power line may include a second_first portion and a second_second portion. The second_first portion and the second_second portion of the second power line may be formed from different layers. The second_second portion of the second power line may overlap the first power line. The second_first portion of the second power line and the first power line may be formed from a same layer.

In an exemplary embodiment of the inventive concept, the first voltage may be a driving voltage, and the second voltage may be a common voltage.

In an exemplary embodiment of the inventive concept, an insulation layer may be disposed between the second_first portion and the second_second portion of the second power line. The second_first portion and the second_second portion may contact each other through a contact hole formed through the insulation layer.

In an exemplary embodiment of the inventive concept, the insulation layer may include an organic insulation material.

In an exemplary embodiment of the inventive concept, the first power line may include a first_first portion and a first_second portion. The first_first portion and the second_first portion of the second power line may be formed from a same layer. The first_second portion of the first power line and the second_second portion of the second power line may be formed from a same layer.

In an exemplary embodiment of the inventive concept, the peripheral area may include a first organic film area, a second organic film area spaced apart from the first organic film area and contacting the display area, and an non-organic film area between the first organic film area and the second organic film area.

In an exemplary embodiment of the inventive concept, the display apparatus may further include a base substrate on which the first power line, the second power line, and the plurality of pixels are formed. The first organic film area may include a bending area, and the base substrate is configured to be bent at the bending area.

In an exemplary embodiment of the inventive concept, the display apparatus may further include an inorganic insulation layer disposed between the insulation layer and the first_first portion of the first power line.

In an exemplary embodiment of the inventive concept, the second voltage may be a driving voltage, and the first voltage may be a common voltage.

In an exemplary embodiment of the inventive concept, the display apparatus may further include an organic insulation layer disposed between the second_second portion of the second power line and the first power line, and including an organic insulation material.

In an exemplary embodiment of the inventive concept, the display apparatus may further include a base substrate on which the first power line, the second power line, and the plurality of pixels are formed. An inorganic insulation layer or a first organic insulation layer may be disposed between the second_first portion of the second power line and the base substrate, In an exemplary embodiment of the inventive concept, the peripheral area may include a first organic film area, a second organic film area which is spaced apart from the first organic film area and contacts the display area, and a non-organic film area between the first organic film area and the second organic film area. Between the base substrate and the first_first portion of the first power line or the second_first portion of the second power line, the inorganic insulation layer may be formed in the second organic film area and the non-organic film area, and the first organic insulation layer may be formed in the first organic film area.

In an exemplary embodiment of the inventive concept, the display apparatus may further include a second organic insulation layer between the second_first portion and the second_second portion of the second power line.

In an exemplary embodiment of the inventive concept, the display apparatus may further include an inorganic insulation film between the second_first portion of the second power line and the second organic insulation layer.

In an exemplary embodiment of the inventive concept, the inorganic insulation film may be disposed in the non-organic film area. The second organic insulation layer may be disposed in the second organic film area.

In an exemplary embodiment of the inventive concept, each of the plurality of pixels may include a thin film transistor, a pixel electrode electrically connected to the thin film transistor, an opposite electrode facing the pixel electrode, and an emission layer between the pixel electrode and the opposite electrode.

According to an exemplary embodiment of the inventive concept, a display apparatus includes a display area in which a plurality of pixels are disposed to display an image and a peripheral area which is a non-display area, the peripheral area including a first organic film area, a second organic film area spaced apart from the first organic film area adjacent to the display area, and a non-organic film area between the first organic film area and the second organic film area. The display apparatus includes a base substrate, a first power line which is formed along the first organic film area, the non-organic film area, and the second organic film area on the base substrate, a second power line including a second_first portion which is spaced apart from the first power line on the base substrate, and formed along the first organic film area, the non-organic film area, and the second organic film area, and a second_second portion which overlaps the first power line in the second organic film area, and an organic insulation layer formed between the second_first portion and the second_second portion of the second power line in the second organic film area, and not formed in the non-organic film area.

In an exemplary embodiment of the inventive concept, the display apparatus may further include an inorganic insulation film disposed in the second organic film area, the non-organic film area, and the first organic film area, and disposed on the first power line and the second_first portion of the second power line to cover the first power line and the second power line.

In an exemplary embodiment of the inventive concept, the second_first portion and the second_second portion of the second power line may be electrically connected to each other through a contact hole formed through the inorganic insulation film and the organic insulation layer in the second organic film area.

According to an exemplary embodiment of the inventive concept, a display apparatus includes a display area in which a plurality of pixels are disposed to display an image and a peripheral area which is a non-display area, the peripheral area including a first organic film area, a second organic film area spaced apart from the first organic film area adjacent to the display area, and a non-organic film area between the first organic film area and the second organic film area. The display apparatus includes a base substrate, a first power line, a second power line, a first organic insulation layer, and an inorganic insulation layer. The first power line includes a first_first portion formed along the first organic film area, the non-organic film area, and the second organic film area on the base substrate, a first_second portion formed only in the second organic film area, and a first_third portion formed only in the first organic film area and the non-organic film area. The second power line includes a second_first portion which is spaced apart from the first power line, and formed along the first organic film area, the non-organic film area, and the second organic film area, and a second_second portion formed only in the first organic film area and the non-organic film area. The first organic insulation layer is disposed on the base substrate in the first organic film area. The inorganic insulation layer is disposed on the base substrate in the non-organic film area and the second organic film area. The second_first portion is disposed on the inorganic insulation layer or the first organic insulation layer. The first_second portion overlaps the first_first portion in the second organic film area. The first_third portion overlaps the first_first portion in the first organic film area with a second organic insulation layer disposed therebetween. The second_second portion overlaps the second_first portion in the first organic film area with the second organic insulation layer disposed therebetween.

BRIEF DESCRIPTION OF THE DRAWINGS

The above and other features of the inventive concept will become more apparent by describing in detail exemplary embodiments thereof with reference to the accompanying drawings.

FIG. 6 is a partial enlarged view illustrating a display apparatus according to an exemplary embodiment of the inventive concept.

DETAILED DESCRIPTION OF THE EMBODIMENTS

Figure 1:
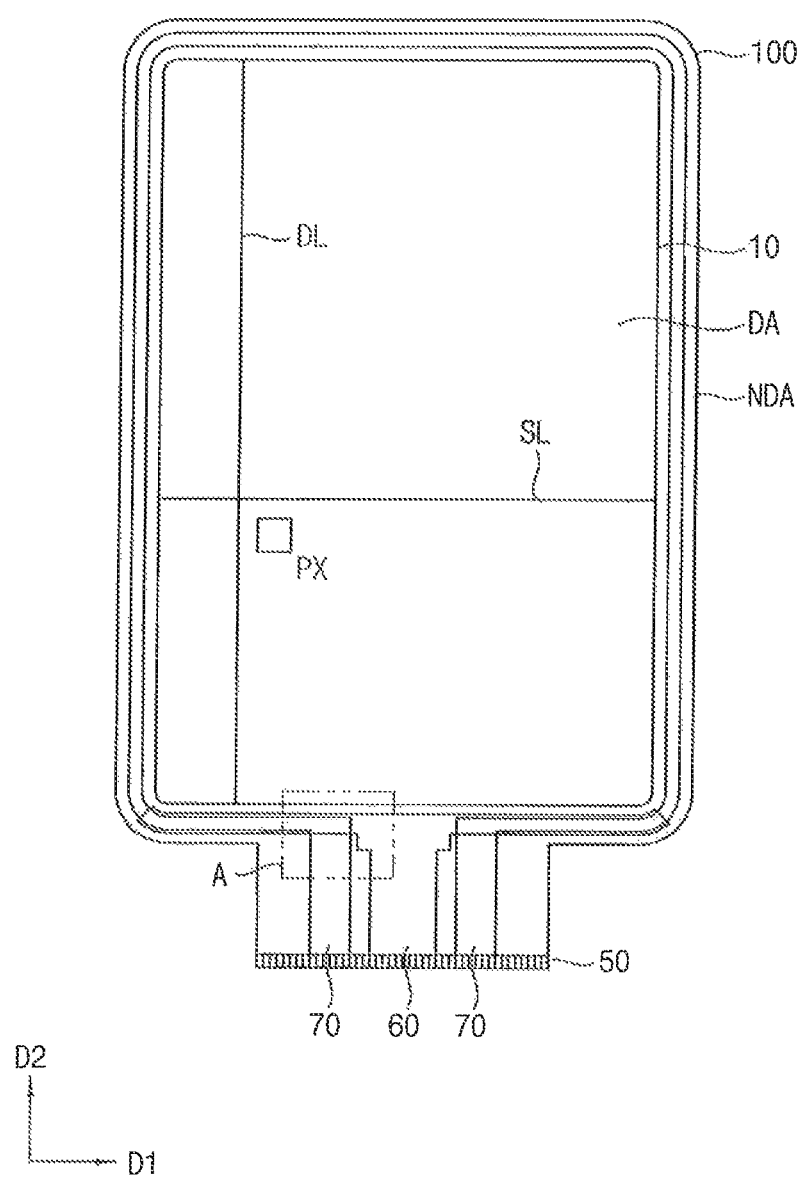
FIG. 1 is plan view illustrating a display apparatus according to an exemplary embodiment of the inventive concept.

Exemplary embodiments of the inventive concept provide a display apparatus capable of reducing a peripheral area which is a non-display area.

Hereinafter, the exemplary embodiments of the inventive concept will be explained in detail with reference to the accompanying drawings. Like reference numerals may refer to like elements throughout this application.

FIG. 1 is plan view illustrating a display apparatus according to an exemplary embodiment of the inventive concept.

Referring to FIG. 1, the display apparatus may include a display portion 10 disposed on a base substrate 100, a scan driver, a data driver, a terminal unit 50, a first power line 60, and a second power line 70.

The display portion 10 may include a plurality of pixel PX, each of which is electrically connected to a scan line SL extending in a first direction D1 and a data line DL extending in a second direction D2 that crosses the first direction D1. Each of the pixels PX may emit red, green, blue, or white light, and may include, for example, organic light emitting diodes. The display portion 10 may provide a predetermined image by using light emitted from the pixels PX. A display area DA may be defined by the pixels PX. A peripheral area NDA, which is a non-display area, is an area in which the pixels PX are not disposed. An image is not provided in the peripheral area NDA. The peripheral area NDA may surround and be adjacent to the display area DA.

The scan driver may be disposed on the base substrate 100 in the peripheral area NDA, and may generate and transmit a scan signal to the pixel PX through the scan line SL.

The data driver may be disposed on the base substrate 100 in the peripheral area NDA, and may generate and transmit a data signal to the pixel PX through the data line DL. The data driver may be disposed on one side of the display portion 10, for example, below the display portion 10 on which the terminal unit 50 is disposed The terminal unit 50 may be disposed at one end of the base substrate 100 and may include a plurality of terminals. In exemplary embodiments of the inventive concept, the terminal unit 50 is covered with an insulating layer, and is exposed and electrically connected to a controller, such as a flexible printed circuit board or an integrated circuit (IC) chip. The controller may convert a plurality of image signals received from the outside into a plurality of image data signals, and transmit the image data signals to the data driver via the plurality of terminals. Further, the controller may receive a vertical synchronization signal, a horizontal synchronization signal, and a clock signal, may generate control signals for controlling the driving of the scan driver and the data driver, and may transmit the control signals to corresponding drivers via the terminals. The controller may transmit a driving voltage ELVDD and a common voltage ELVSS to the first power line 60 and the second power line 70 via the terminals.

The first power line 60 may be disposed in the peripheral area NDA. For example, the first power line 60 may be disposed between the data driver and the display portion 10. The first power line 60 may provide the driving voltage ELVDD to the pixels PX.

The second power line 70 may be disposed in the peripheral area NDA, and may provide the common voltage ELVSS to an opposite electrode of an organic light-emitting diode (OLED) of the pixel PX. For example, the second power line 70 may have a loop shape in which one side is open, and may extend along the edge of the base substrate 100 in an area excluding the terminal unit 50.

The display portion 10 may have an approximately quadrangular shape and include a rounded corner region.

Here, since the first power line 60 and the second power line 70 are overlapped with each other in the peripheral area NDA, it is possible to reduce a width of the peripheral area NDA, especially the lower peripheral area of the display apparatus, as compared to a case where the first power line 60 and the second power line 70 are formed from the same layer and arranged on the same plane.

Figure 2:
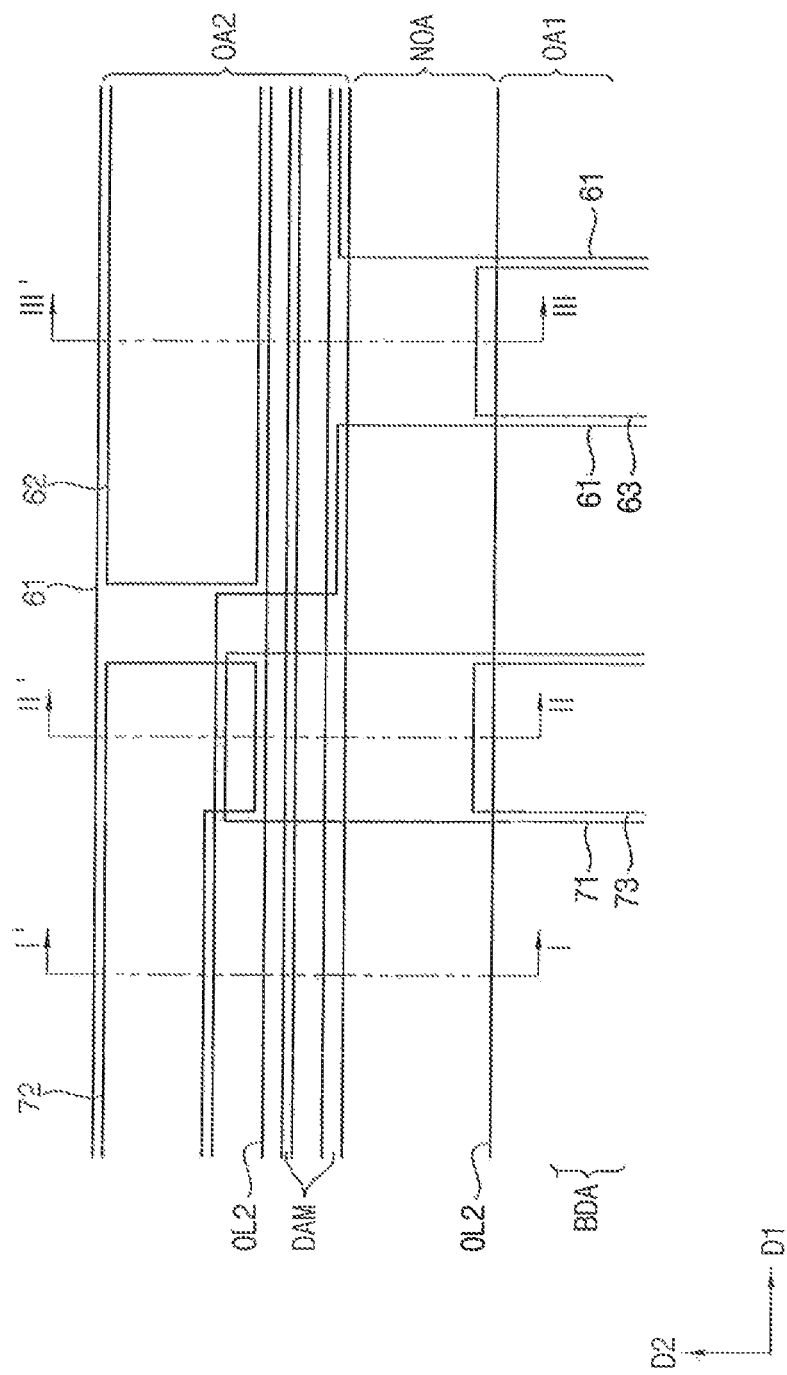
FIG. 2 is an enlarged view illustrating an area 'A' of the display apparatus of FIG. 1 according to an exemplary embodiment of the inventive concept.
Figure 3A:
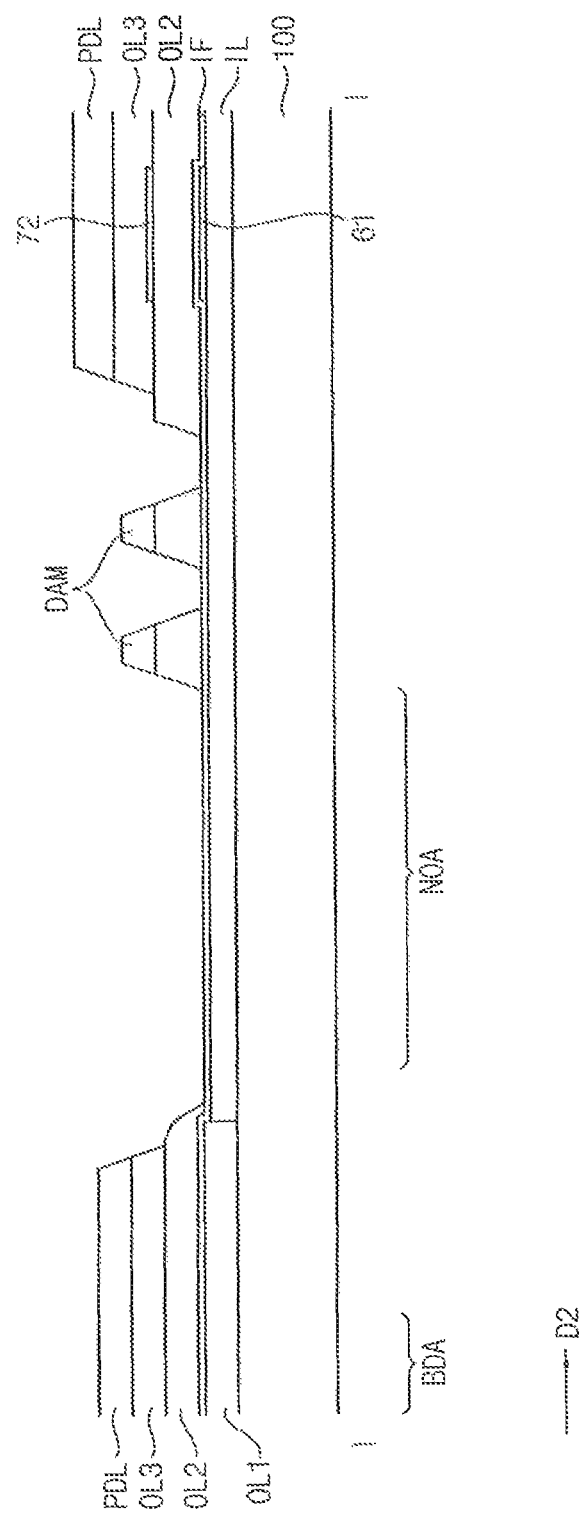
FIG. 3A is a cross-sectional view taken along a line I-I' of FIG. 2 according to an exemplary embodiment of the inventive concept.
Figure 3B:
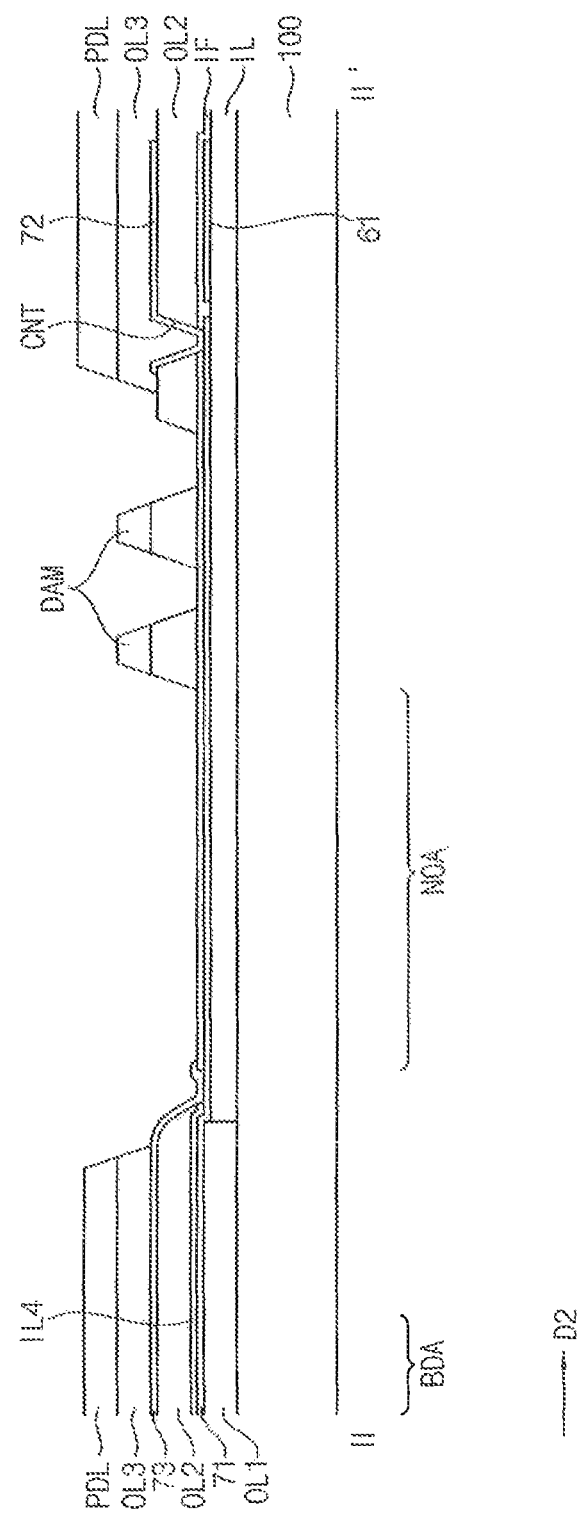
FIG. 3B is a cross-sectional view taken along a line II-II' of FIG. 2 according to an exemplary embodiment of the inventive concept.
Figure 3C:
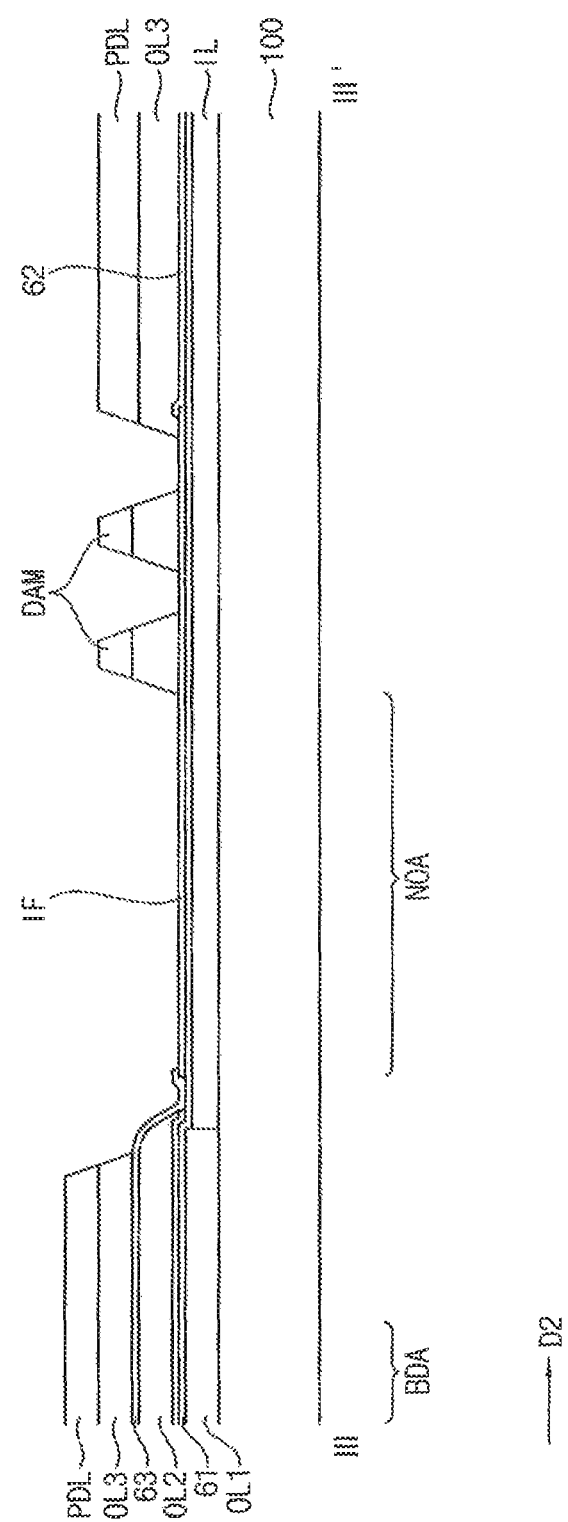
FIG. 3C is a cross-sectional view taken along a line III-III' of FIG. 2 according to an exemplary embodiment of the inventive concept.

FIG. 2 is an enlarged view illustrating an area 'A' of the display apparatus of FIG. 1 according to an exemplary embodiment of the inventive concept. FIG. 3A is a cross-sectional view taken along a line I-I' of FIG. 2 according to an exemplary embodiment of the inventive concept. FIG. 3B is a cross-sectional view taken along a line II-IF of FIG. 2 according to an exemplary embodiment of the inventive concept. FIG. 3C is a cross-sectional view taken along a line III-III' of FIG. 2 according to an exemplary embodiment of the inventive concept.

Figure 5:
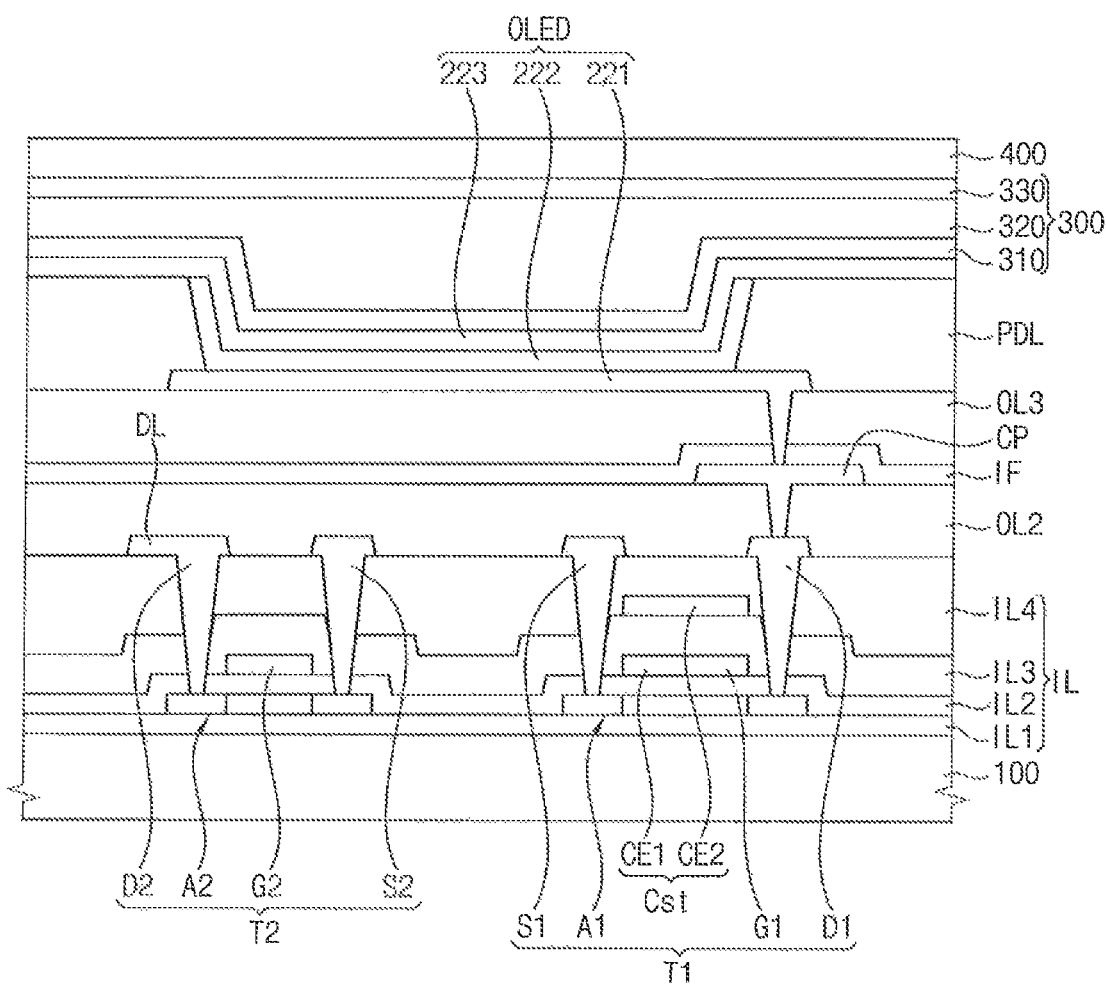
FIG. 5 is a cross-sectional view illustrates the pixel of the display apparatus of FIG. 4 according to an exemplary embodiment of the inventive concept.

Referring to FIGS. 1, 2, 3A, 3B, and 3C, the display apparatus may include a base substrate 100, an inorganic insulation layer IL, a first organic insulation layer OL1, a first data pattern, an inorganic insulation film IF, a second organic insulation layer OL2, a second data pattern, a third organic insulation layer OL3, a pixel defining layer PDL, and a thin film encapsulation layer (300 of FIG. 5)

The display apparatus may include the display area DA in which an image is displayed and the peripheral area NDA, which is a non-display area adjacent to the display area DA. The peripheral area NDA may include a second organic film area OA2, a non-organic film area NOA, and a first organic film layer OA1. The second organic film area OA2 may make contact with the display area DA. The first organic film area OA1 may be spaced apart from the second organic film area OA2 in the second direction D2. The non-organic film area NOA may be disposed between the first organic film area OA1 and the second organic film area OA2.

Here, the first and second organic film areas OA1 and 0A2 are regions in which the first, second, and third organic insulation layers OL1, OL2, and OL3 including an organic insulating material are formed, and the non-organic film area NOA are regions in which the first, second, and third organic insulation layers OL1, OL2, and OL3 are not formed. Accordingly, it is possible to prevent moisture and the like from penetrating structures in the display area DA through organic insulating films from the first organic film area OA1 which is at an edge of the peripheral area NDA. However, an organic layer (320 in FIG. 5) of the thin film encapsulation layer, which is not directly connected to the structures in the display area DA, may be formed in the non-organic film area NOA.

The base substrate 100 may be formed using a flexible marital. For example, the base substrate 100 may be formed of a flexible plastic material such as polyimide. However, the inventive concept is not limited thereto. According to an exemplary embodiment of the inventive concept, the flexible plastic material may include polyethersulphone (PES), polyacrylate (PAR), polyether imide (PEI), polyethyelenen naphthalate (PEN), polyethyelenetereпthalate (PET), polyphenylene sulfide (PPS), polyallylate, polyimide, polycarbonate (PC), cellulose triacetate (TAC), cellulose acetate propionate (CAP), cyclic olefin polymer, cyclic olefin copolymer, etc.

The inorganic insulation layer IL may be disposed on the base substrate 100 in the second organic film area OA2 and the non-organic film area NOA. The inorganic insulation layer IL may include first to fourth inorganic insulation layers (IL1, IL2, IL3, IL4 of FIG. 5) The first to fourth inorganic insulation layers may be disposed on the base substrate 100. The first to fourth inorganic insulating layers are formed to insulate a semiconductor layer, a first gate pattern, and a second gate pattern in the display area DA from one another, and each may include an inorganic insulating material. (See FIG. 5 for a detailed description)

The first organic insulation layer OL1 may be disposed on the base substrate 100 in the first organic film area OA1. The first organic insulation layer OL1 may be formed at substantially the same height as the inorganic insulation layer IL, so that a level difference between the first organic film area OA1 and the non-organic film area NOA may be minimized. The first organic insulation layer OL1 may include a single layer or a multi-layer including an organic material. The organic material may include a general purpose polymer such as, for example, polymethylmethacrylate (PMMA) or polystylene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Further, the first organic insulation layer OL1 may include a composite stacked layer of an inorganic insulating layer and an organic insulating layer.

The first data pattern including a first_first portion 61 of the first power line 60 and a second_first portion 71 of the second power line 70 may be disposed on the first organic insulation layer OL1 and the inorganic insulation layer IL.

The first_first portion 61 of the first power line 60 may be formed along the second direction D2 in the first organic film area OA1, the non-organic film area NOA, and the second organic film area OA2.

The second_first portion 71 of the second power line 70 may be spaced apart from the first_first portion 61 in the first direction D1, and may be formed along the second direction D2 in the first organic film area OA1, the non-organic film area NOA, and the second organic film area OA2.

In addition, the second_first portion 71 may extend from the second organic film area OA2 in the first direction D1, and may overlap a first_second portion 62 of the first power line 60, which will be described below.

Accordingly, the first power line 60 and the second power line 70 overlap each other in the second organic film area OA2 with the second organic insulation layer OL2 disposed therebetween, so that a width of the peripheral area NDA due to a width of a power line may be reduced. Thus, it is possible to provide a display apparatus in which the peripheral area NDA which is a non-display area is reduced.

The inorganic insulation film IF may be disposed on the first_first portion 61 of the first power line 60 and the second_first portion 71 of the second power line 70. The inorganic insulation film IF may include inorganic insulation material. For example, the inorganic insulation film IF may include silicon oxide (SiOx), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO2), etc.

The second organic insulation layer OL2 may be disposed on the inorganic insulation film IF. The second organic insulation layer OL2 may be formed in the first organic film area OA1 and the second organic film area OA2, and may not be formed in the non-organic film area NOA. The second organic insulation layer OL2 may include a single layer or a multi-layer including an organic material. The organic material may include a general purpose polymer such as, for example, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Further, the second organic insulation layer OL2 may include a composite stacked layer of an inorganic insulating layer and an organic insulating layer.

The second data pattern including the first_second portion 62 and a first_third portion 63 of the first power line 60, and a second_second portion 72 and a second_third portion 73 of the second power line 70 may be disposed on the second organic insulation layer OL2.

The first_second portion 62 may extend in the first direction D1 in the second organic film area OA2, and overlap the second_first portion 71 of the second power line 70 in the second organic film area OA2. The first_second portion 62 may be electrically connected to the first_first portion 61 of the first power line 60 through a contact hole formed through the inorganic insulation film IF and the second organic insulation layer OL2 in the second organic film area OA2. The first_third portion 63 may be overlapped with the first_first portion 61 or be electrically connected to the first_first portion 61 through a contact hole or the like in the first organic film area OA1.

The second_second portion 72 may make contact with the second_first portion 71 in the second organic film area OA2 through a contact hole (e.g., CNT) formed through the inorganic insulation film IF and the second organic insulation layer OL2. The second_third portion 73 may be overlapped with the second_first portion 71 or be electrically connected to the second_first portion 71 through a contact hole or the like in the first organic film area OA1.

The third organic insulation layer OL3 may be disposed on the first_second portion 62, the first_third portion 63, the second_second portion 72, and the second_third portion 73. The third organic insulation layer OL3 may be formed in the first organic film area OA1 and the second organic film area OA2, and may not be formed in the non-organic film area NOA. The third organic insulation layer OL3 may include a single layer or a multi-layer including an organic material. The organic material may include a general purpose polymer such as, for example, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Further, the third organic insulation layer OL3 may include a composite stacked layer of an inorganic insulating layer and an organic insulating layer.

The pixel defining layer PDL may be disposed on the third organic insulation layer OL3. The pixel defining layer PDL may be formed in the first organic film area OA1 and the second organic film area OA2, and may not be formed in the non-organic film area NOA.

A dam DAM which extends in the first direction D1 and is formed by a portion of the third organic insulation layer OL3 or the pixel defining layer PDL may be further formed in the second organic film area OA2 on the inorganic insulation film IF. The dam DAM may be used as a dam for forming an organic film or the like.

The thin film encapsulation layer (300 of FIG. 5) may be formed to cover and seal the non-organic film area NOA and the second organic film area OA2.

The first power line 60 may provide a first voltage to the pixels. The second power line 70 may provide a second voltage which is different from the first voltage to the pixel. The first voltage may be the driving voltage ELVDD, and the second voltage may be the common voltage ELVSS.

Since the first power line 60 overlaps at least a portion of the second power line 70 in the peripheral area NDA, a width of the peripheral area NDA may be reduced.

The first organic film area OA1 may include a bending area BDA. The base substrate may be a flexible substrate, and may be bent at the bending area BDA. The first_first portion 61 and the second_first portion 71, which are the first data pattern, are disposed between the first and second organic insulation layers OL1 and OL2 in the bending area BDA. The first_third portion 63 and the second_third portion 73, which are the second data pattern, are disposed between the second and third organic insulating layers OL2 and OL3. Thus, stress can be dispersed at the time of bending, and wiring breakage due to bending can be prevented.

Figure 4:
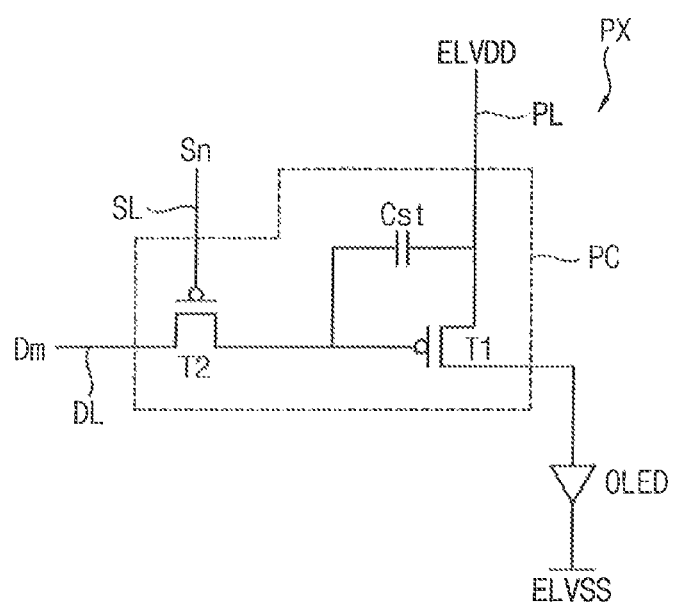
FIG. 4 is an equivalent circuit diagram of one pixel of a display apparatus according to an exemplary embodiment of the inventive concept.

FIG. 4 is an equivalent circuit diagram of one pixel of a display apparatus according to an exemplary embodiment of the inventive concept.

Referring to FIG. 4, each pixel PX may include a pixel circuit PC connected to the scan line SL and the data line DL, and a light-emitting device connected to the pixel circuit PC. The light-emitting device may be, for example, an organic light-emitting diode (OLED).

The pixel circuit PC may include a driving thin film transistor (TFT) T1, a switching TFT T2, and a storage capacitor Cst. The switching TFT T2 may be connected to the scan line SL and the data line DL, and transmit a data signal Dm input via the data line DL to the driving TFT T1 in response to a scan signal Sn input via the scan line SL.

The storage capacitor Cst may be connected to the switching TFT T2 and a driving voltage line PL, and store a voltage corresponding to a difference between a voltage received from the switching TFT T2 and the driving voltage ELVDD supplied to the driving voltage line PL.

The driving TFT T1 may be connected to the driving voltage line PL and the storage capacitor Cst, and may control a driving current flowing through an OLED from the driving voltage line PL in response to a voltage value stored in the storage capacitor Cst. The OLED may be connected between the driving TFT T1 and the common voltage ELVSS. The OLED may emit light having a predetermined brightness by using the driving current.

FIG. 5 is a cross-sectional view illustrating the pixel of the display apparatus of FIG. 4 according to an exemplary embodiment of the inventive concept.

Referring to FIG. 5, the pixel PX of the display apparatus may include the pixel circuit PC formed above the base substrate 100 and the OLED connected to the pixel circuit PC. For convenience of explanation, a description of the pixel PX is made according to a stacking sequence.

The first inorganic insulation layer IL1 may be disposed on the base substrate 100, may reduce or block penetration of, for example, foreign substance, moisture, or external air from below the base substrate 100, and may provide a planarization surface above the base substrate 100. The first inorganic insulation layer IL1 may include an inorganic material such as, for example, an oxide layer, a nitride layer, etc. The first inorganic insulation layer IL1 may include a single-layered or multi-layered structure.

A first TFT T1 (e.g., the driving TFT T1) may include a semiconductor layer A1, a gate electrode G1, a source electrode S1, and a drain electrode D1. A second TFT T2 (e.g., the switching TFT T2) may include a semiconductor layer A2, a gate electrode G2, a source electrode S2, and a drain electrode D2.

In exemplary embodiments of the inventive concept, the semiconductor layers A1 and A2 may include, for example, amorphous silicon or polycrystalline silicon. In exemplary embodiments of the inventive concept, the semiconductor layers A1 and A2 may include, for example, an oxide of at least one of In, Ga, Sn, Zr, V, Hf, Cd, Ge, Cr, Ti, or Zn. The semiconductor layers A1 and A2 may include a channel region, and a source region and a drain region doped with impurities.

The second inorganic insulation layer IL2 may be disposed on the semiconductor layers A1 and A2. The second inorganic insulation layer IL2 may include silicon oxide (SiOx), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO2), etc.

A first gate pattern including the gate electrodes G1 and G2 may be disposed on the second inorganic insulation layer IL2. The gate electrodes G1 and G2 may include a single layer or a multi-layer. For example, the gate electrodes G1 and G2 may be a single layer of Mo.

The third inorganic insulation layer IL3 may be disposed on the second inorganic insulation layer IL2 on which the gate pattern is disposed. The third inorganic insulation layer IL3 may include inorganic material including an oxide or a nitride. The third inorganic insulation layer IL3 may be a dielectric layer. For example, the third inorganic insulation layer IL3 may include silicon oxide (SiOx), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO2), etc.

A second gate pattern including a second electrode CE2 of the storage capacitor Cst may be disposed on the third inorganic insulation layer IL3. The second electrode CE2 of the storage capacitor Cst may overlap a first electrode CE1 with the third inorganic insulation layer IL3 disposed therebetween. The second electrode CE2 may include a conductive material including, for example, Mo, Al, Cu, Ti, etc. The second electrode CE2 may include a single layer or a multi-layer including, for example, Mo, Al, Cu, Ti, etc. For example, the second electrode CE2 may be a single layer of Mo or a multi-layer of Mo/Al/Mo.

The first electrode CE1 of the storage capacitor Cst may overlap the first TFT T1. For example, the gate electrode G1 of the first TFT T1 may perform a function of the first electrode CE1 of the storage capacitor Cst.

The fourth inorganic insulation layer IL4 may be disposed on the second gate pattern. The fourth inorganic insulation layer IL4 may be an interlayer dielectric. The fourth inorganic insulation layer IL4 may include silicon oxide (SiOx), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO2), etc.

The first data pattern including source electrodes S1 and S2 and drain electrodes D1 and D2 may be disposed on the fourth inorganic insulation layer IL4. The first data pattern may further include a first_first portion of a first power line (e.g., 61 of FIGS. 2 and 3A to 3C), and a second_first portion of a second power line (e.g., 71 of FIGS. 2 and 3A to 3C)

The source electrodes S1 and S2 and the drain electrodes D1 and D2 may be electrically connected to the source and drain regions of the semiconductor layers A1 and A2 through contact holes formed through the first to fourth inorganic insulation layers IL1, IL2, IL3, and IL4 (IL). The source electrodes S1 and S2 and the drain electrodes D1 and D2 may include a conductive material including, for example, Mo, Al, Cu, Ti, etc., and may include a single layer or a multi-layer including the above material. For example, the source electrodes S1 and S2 and the drain electrodes D1 and D2 may include a multi-structure of Ti/Al/Ti.

The second organic insulation layer OL2 may be disposed on the source electrodes S1 and S2, and the drain electrodes D1 and D2. The second organic insulation layer OL2 may include a single layer or a multi-layer including an organic material. The organic material may include a general purpose polymer such as, for example, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Further, the second organic insulation layer OL2 may include a composite stacked layer of an inorganic insulating layer and an organic insulating layer.

The second data pattern including a contact pad CP may be disposed on the second organic insulation layer OL2. The contact pad CP may be electrically connected to the drain electrode D1 through a contact hole formed through the second organic insulation layer OL2. The second data pattern may further include a first_second portion and a first_third portion of the first power line (e.g., 62 and 63 of FIGS. 2 and 3A to 3C), and a second_second portion and a second_third portion of the second power line (e.g., 72 and 73 of FIGS. 2 and 3A to 3C).

The third organic insulation layer OL3 may be disposed on the contact pad CP. The third organic insulation layer OL3 may include a single layer or a multi-layer including an organic material. The organic material may include a general purpose polymer such as, for example, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. Further, the third organic insulation layer OL3 may include a composite stacked layer of an inorganic insulating layer and an organic insulating layer.

The OLED may be disposed on the third organic insulation layer OL3. The OLED may include a pixel electrode 221, an emission layer 222, and an opposite electrode 223. The pixel electrode 221 may be electrically connected to the contact pad CP through a contact hole formed through the third organic insulation layer OL3.

The pixel electrode 221 may be a reflective electrode. For example, the pixel electrode 221 may include a reflective layer including, for example, Ag, Mg, Al, Pt, Pd, Au, Ni, Nd, Jr, Cr, or a compound thereof, and a transparent or semi-transparent electrode layer formed above the reflective layer. The transparent or semi-transparent electrode layer may include at least one of, for example, an indium tin oxide (ITO), an indium zinc oxide (IZO), a zinc oxide (ZnO), In2O3, an indium gallium oxide (IGO), or an aluminum zinc oxide (AZO).

The pixel defining layer PDL, which is an insulating material, may be disposed above the pixel electrode 221. The pixel defining layer PDL may include at least one organic insulating material including, for example, polyimide, polyamide, an acryl resin, benzocyclobutene (BCB), or a phenol resin. The pixel defining layer PDL may be formed using, for example, a spin coating method, etc. The pixel defining layer PDL may expose the pixel electrode 221, and the emission layer 222 may be disposed above the exposed region.

The emission layer 222 may include an organic material including fluorescent or phosphorescent material emitting red, green, blue, or white light. The emission layer 222 may include a low molecular organic material or a polymer organic material. A functional layer such as, for example, a hole transport layer (HTL), a hole injection layer (HIL), an electron transport layer (ETL), or an electron injection layer (EIL) may be selectively further disposed below and above the emission layer 222.

The opposite electrode 223 may be a transparent electrode. For example, the opposite electrode 223 may be a transparent or semi-transparent electrode and may include a metallic thin film having a small work function and including, for example, Li, Ca, LiF/Ca, LiF/Al, Al, Ag, Mg, or a compound thereof.

Further, a transparent conductive oxide (TCO) layer including ITO, IZO, ZnO, or In2O3 may be further disposed above the metallic thin film.

The thin film encapsulation layer 300 may prevent penetration of, for example, external moisture and oxygen. The thin film encapsulation layer 300 may include at least one organic layer 320 and one or more inorganic layers 310 and 330. The at least one organic layer 320 and the one or more inorganic layers 310 and 330 may be stacked alternately. Although FIG. 5 illustrates an example in which the thin film encapsulation layer 300 includes two inorganic layers 310 and 330 disposed below and above, respectively, one organic layer 320, a stacking sequence and a number of organic layers 320 and inorganic layers 310 and 330 are not limited to the exemplary embodiment illustrated in FIG. 5.

A touch film 400 may be disposed above the thin film encapsulation layer 300 to implement a touchscreen function of the display apparatus. The touch film 400 may include a touch electrode of various patterns. The touch film 400 may be, for example, a resistive overlay touch film or a capacitive overlay touch film, etc.

Although top-gate type TFTs are illustrated in which the gate electrodes G1 and G2 of the first TFT T1 and the second TFT T2 are respectively disposed above the semiconductor layers A1 and A2 with the second inorganic insulation layer IL2 disposed therebetween, the inventive concept is not limited thereto. For example, in exemplary embodiments of the inventive concept, the first TFT T1 and the second TFT T2 may be bottom-gate type TFTs.

Although FIGS. 4 and 5 illustrate a case in which the pixel PX includes two TFTs and one storage capacitor, the inventive concept is not limited thereto.

Figure 7A:
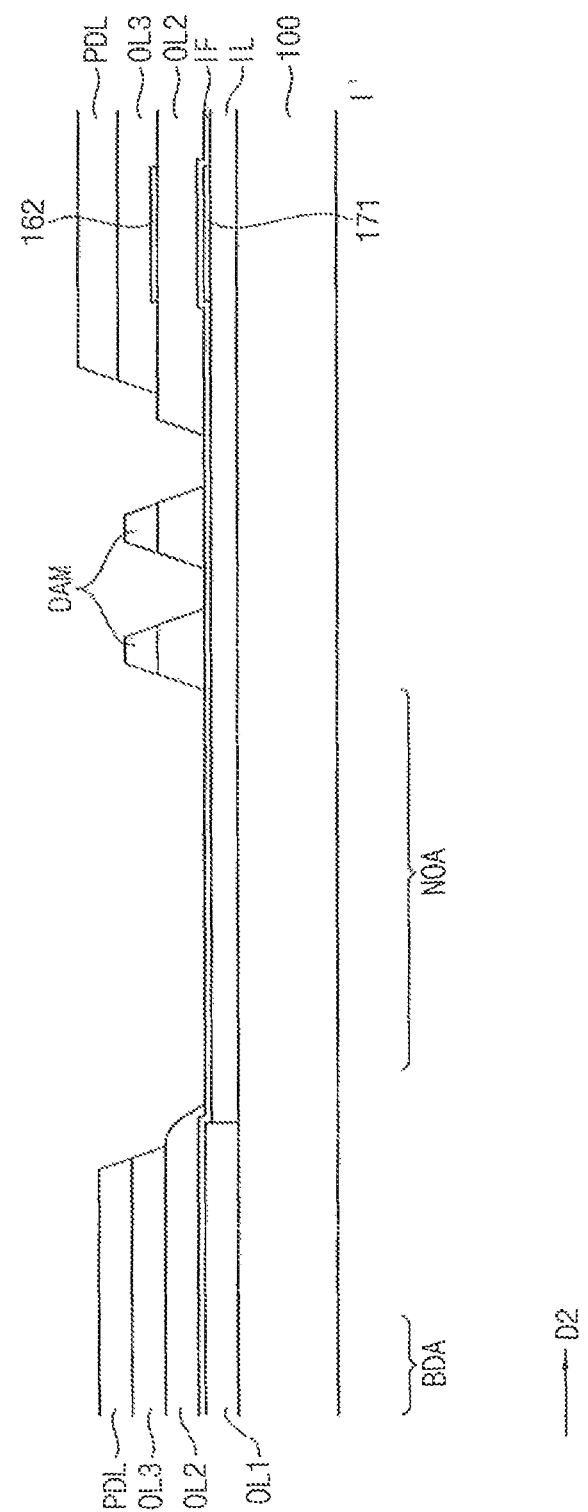
FIG. 7A is a cross-sectional view taken along a line I-I' of FIG. 6 according to an exemplary embodiment of the inventive concept.
Figure 7B:
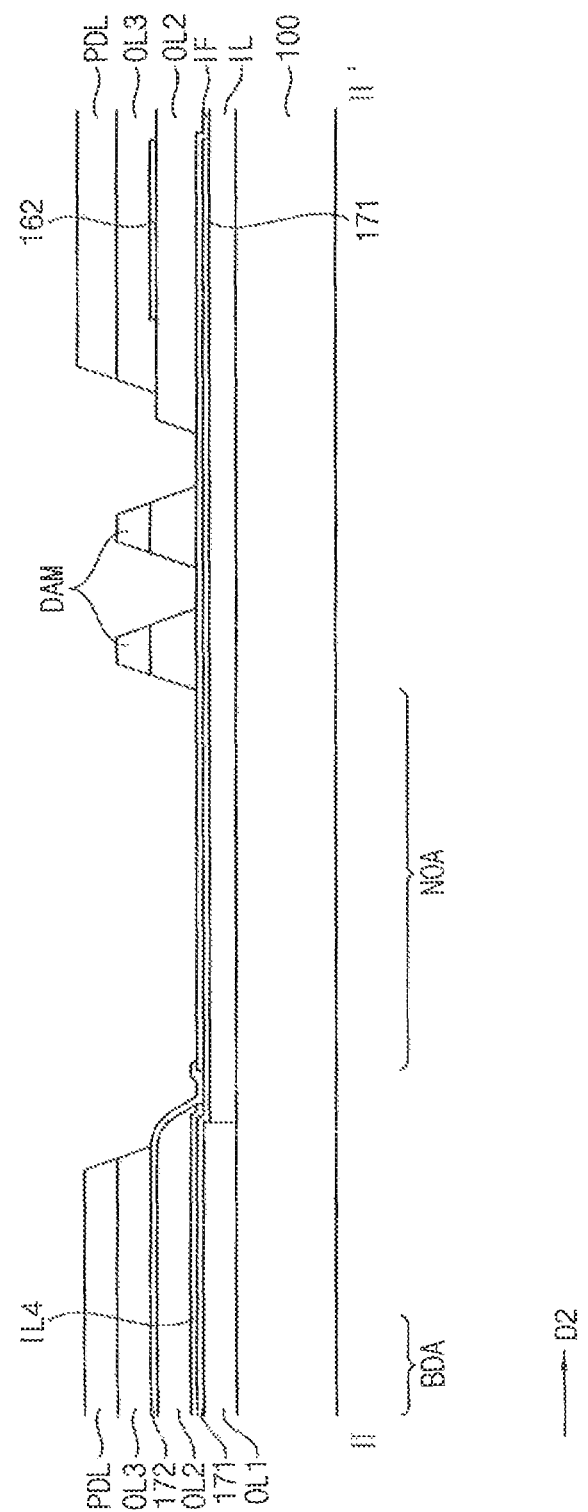
FIG. 7B is a cross-sectional view taken along a line II-II' of FIG. 6 according to an exemplary embodiment of the inventive concept.
Figure 7C:
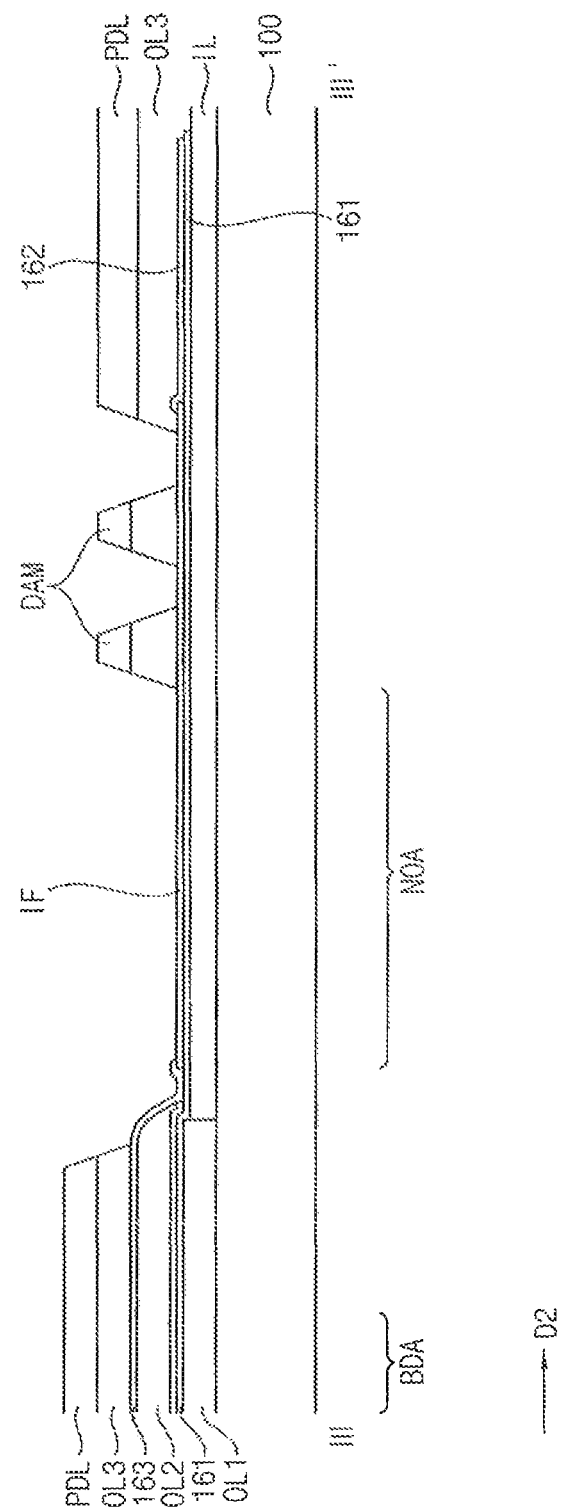
FIG. 7C is a cross-sectional view taken along a line III-III' of FIG. 6 according to an exemplary embodiment of the inventive concept.

FIG. 6 is a partial enlarged view illustrating a display apparatus according to an exemplary embodiment of the inventive concept. FIG. 7A is a cross-sectional view taken along a line I-I' of FIG. 6 according to an exemplary embodiment of the inventive concept. FIG. 7B is a cross-sectional view taken along a line II-II' of FIG. 6 according to an exemplary embodiment of the inventive concept. FIG. 7C is a cross-sectional view taken along a line III-III' of FIG. 6 according to an exemplary embodiment of the inventive concept.

Referring to FIGS. 6, 7A, 7B, and 7C, the display apparatus may be substantially the same as the display apparatus of FIGS. 1, 2, and 3A to 3C, except for a first power line and a second power line. Therefore, repeat descriptions will be omitted.

The display apparatus may include the base substrate 100, the inorganic insulation layer IL, the first organic insulation layer OL1, the first data pattern, the inorganic insulation film IF, the second organic insulation layer OL2, the second data pattern, the third organic insulation layer OL3, the pixel defining layer PDL, and the thin film encapsulation layer.

The display apparatus may include the display area DA in which an image is displayed and the peripheral area NDA, which is a non-display area adjacent to the display area DA. The peripheral area NDA may include the second organic film area OA2, the non-organic film area NOA, and the first organic film area OA1.

The inorganic insulation layer IL may be disposed in the second organic film area OA2 and the non-organic film area NOA on the base substrate 100. The first organic insulation layer OL1 may be disposed in the first organic film area OA1 on the base substrate 100.

The first data pattern including a first_first portion 161 of the first power line and a second_first portion 171 of the second power line may be disposed on the first organic insulation layer OL1 and the inorganic insulation layer IL.

The first_first portion 161 of the first power line may be formed along the second direction D2 in the first organic film area OA1, the non-organic film area NOA, and the second organic film area OA2.

The second_first portion 171 of the second power line may be spaced apart from the first_first portion 161 in the first direction D1, and may be formed along the second direction D2 in the first organic film area OA1, the non-organic film area NOA, and the second organic film area OA2. The second_first portion 171 may extend along the first direction D1 in the second organic film area OA2, and may overlap a first_second portion 162 of the first power line, which will be described below.

Accordingly, the first power line and the second power line overlap each other in the second organic film area OA2 with the second organic insulation layer OL2 disposed therebetween, so that a width of the peripheral area NDA due to a width of a power line may be reduced. Thus, it is possible to provide a display apparatus in which the peripheral area NDA, which is a non-display area, is reduced.

The inorganic insulation film IF may be disposed on the first data pattern. The second organic insulation layer OL2 may be disposed on the inorganic insulation film IF. The second data pattern including the first_second portion 162 and a first_third portion 163 of the first power line, and a second_second portion 172 of the second power line may be disposed on the second organic insulation layer OL2.

The first_second portion 162 may extend in the first direction D1 in the second organic film area OA2, and may be electrically connected to the first_first portion 161 through a contact hole formed through the inorganic insulation film IF and the second organic insulation layer OL2. The first_third portion 163 may overlap the first_first portion 161 in the first organic film area OA1 or be electrically connected to the first_first portion 161 through a contact hole.

The second_second portion 172 may overlap the first_first portion 171 in the first organic film area OA1, or be electrically connected to the first_first portion 171 through a contact hole.

The first power line may provide a first voltage to pixels. The second power line may provide a second voltage which is different from the first voltage to the pixels. The first voltage may be the driving voltage (ELVDD), and the second voltage may be the common voltage ELVSS.

According to exemplary embodiments of the inventive concept, a display apparatus includes a display area in which a plurality of pixels are disposed to display an image and a peripheral area which is a non-display area. The display apparatus includes a first power line which is disposed in the peripheral area and provides a first voltage to the pixels, and a second power line which is disposed in the peripheral area and provides a second voltage different from the first voltage to the pixels. At least a portion of the first power line overlaps the second power line in the peripheral area.

Accordingly, the first power line and the second power line overlap each other in a second organic film area with a second organic insulation layer disposed therebetween, so that a width of the peripheral area due to a width of a power line may be reduced. Thus, it is possible to provide a display apparatus in which the peripheral area, which is a non-display area, is reduced.

In addition, the peripheral area of the display apparatus may include the second organic film area, a non-organic film area, and a first organic film area. Here, the first and second organic film areas are regions in which organic insulating films including an organic insulating material are formed, and the non-organic film area is a region in which the organic insulating films are not formed. Accordingly, it is possible to prevent moisture and the like from penetrating structures in the display area through organic insulating films from the first organic film area which is at an edge of the peripheral area.

While the inventive concept has been shown and described with reference to exemplary embodiments thereof, it will be apparent to those of ordinary skill in the art that various changes in form and details may be made thereto without departing from the spirit and scope of the inventive concept as set forth by the following claims.

What is claimed is:

1. A display apparatus comprising a display area in which a plurality of pixels are disposed to display an image and a peripheral area which is a non-display area, the display apparatus comprising:
   a first power line disposed in the peripheral area and configured to provide a first voltage to the plurality of pixels; and
   a second power line disposed in the peripheral area and configured to provide a second voltage different from the first voltage to the plurality of pixels, and
   wherein at least a portion of the first power line overlaps the second power line in the peripheral area,
   the second power line comprises a second_first portion and a second_second portion,
   the second_first portion and the second_second portion of the second power line are formed from different layers,
   an insulation layer is disposed between the second_first portion and the second_second portion of the second power line, and
   the second_first portion and the second_second portion contact each other through a contact hole formed through the insulation layer.

2. The display apparatus of claim 1, wherein
   the second_second portion of the second power line overlaps the first power line, and
   the second_first portion of the second power line and a portion of the first power line are formed from a same layer.

3. The display apparatus of claim 2, wherein the first voltage is a driving voltage, and the second voltage is a common voltage.

4. The display apparatus of claim 3, wherein the insulation layer comprises an organic insulation material.

5. The display apparatus of claim 4, wherein the first power line comprises a first_first portion and a first_second portion,
   the first_first portion and the second_first portion of the second power line are formed from a same layer, and
   the first_second portion of the first power line and the second_second portion of the second power line are formed from a same layer.

6. The display apparatus of claim 5, wherein the peripheral area comprises a first organic film area, a second organic film area spaced apart from the first organic film area and contacting the display area, and an non-organic film area between the first organic film area and the second organic film area.

7. The display apparatus of claim 6, further comprising a base substrate on which the first power line, the second power line, and the plurality of pixels are formed,
   wherein the first organic film area comprises a bending area, and the base substrate is configured to be bent at the bending area.

8. The display apparatus of claim 7, further comprising an inorganic insulation layer disposed between the insulation layer and the first_first portion of the first power line.

9. The display apparatus of claim 2, wherein the second voltage is a driving voltage, and the first voltage is a common voltage.

10. The display apparatus of claim 9, further comprises an organic insulation layer disposed between the second_second portion of the second power line and the first power line, and comprising an organic insulation material.

11. The display apparatus of claim 10, further comprising:
a base substrate on which the first power line, the second power line, and the plurality of pixels are formed,
wherein an inorganic insulation layer or a first organic insulation layer is disposed between the second_first portion of the second power line and the base substrate.

12. The display apparatus of claim 11, wherein the peripheral area comprises a first organic film area, a second organic film area which is spaced apart from the first organic film area and contacts the display area, and a non-organic film area between the first organic film area and the second organic film area, and
between the base substrate and the first_first portion of the first power line or the second_first portion of the second power line, the inorganic insulation layer is formed in the second organic film area and the non-organic film area, and the first organic insulation layer is formed in the first organic film area.

13. The display apparatus of claim 12, further comprising:
a second organic insulation layer between the second_first portion and the second_second portion of the second power line.

14. The display apparatus of claim 13, further comprising:
an inorganic insulation film between the second_first portion of the second power line and the second organic insulation layer.

15. The display apparatus of claim 14, wherein the inorganic insulation film is disposed in the non-organic film area, and the second organic insulation layer is disposed in the second organic film area.

16. The display apparatus of claim 1, wherein each of the plurality of pixels comprises a thin film transistor, a pixel electrode electrically connected to the thin film transistor, an opposite electrode facing the pixel electrode, and an emission layer between the pixel electrode and the opposite electrode.

17. A display apparatus comprising a display area in which a plurality of pixels are disposed to display an image and a peripheral area which is a non-display area, the peripheral area comprising a first organic film area, a second organic film area spaced apart from the first organic film area adjacent to the display area, and a non-organic film area between the first organic film area and the second organic film area, the display apparatus comprising:
a base substrate;
a first power line formed along the first organic film area, the non-organic film area, and the second organic film area on the base substrate;
a second power line comprising a second_first portion which is spaced apart from the first power line on the base substrate, and formed along the first organic film area, the non-organic film area, and the second organic film area, and a second_second portion which is vertically spaced apart from and overlaps the first power line in the second organic film area;
an organic insulation layer formed between the second_first portion and the second_second portion of the second power line in the second organic film area, and not formed in the non-organic film area; and
an inorganic insulation film disposed in the second organic film area, the non-organic film area, and the first organic film area, and disposed on the first power line and the second_first portion of the second power line to cover at least a portion of the first power line and the second_first portion of the second power line.

18. The display apparatus of claim 17, wherein the second_first portion and the second_second portion of the second power line are electrically connected to each other through a contact hole formed through the inorganic insulation film and the organic insulation layer in the second organic film area.

* * * * *